United States Patent [19]
Ke

[11] Patent Number: 5,774,477
[45] Date of Patent: Jun. 30, 1998

[54] METHOD AND APPARATUS FOR PSEUDORANDOM BOUNDARY-SCAN TESTING

[75] Inventor: Wuudiann Ke, Mercer County, N.J.

[73] Assignee: Lucent Technologies Inc., Murray Hill, N.J.

[21] Appl. No.: 577,454

[22] Filed: Dec. 22, 1995

[51] Int. Cl.⁶ .................................................. G01R 31/28
[52] U.S. Cl. ......................................................... 371/22.32
[58] Field of Search ........................... 371/22.32, 22.5, 371/22.1; 324/73.1, 158 R; 395/183.06

[56] References Cited

U.S. PATENT DOCUMENTS 5,596,584   1/1997   Warren ................................. 395/183.06

OTHER PUBLICATIONS

IEEE Standard Test Access Port and Boundary–Scan Architecture, published by the IEEE, New York, New York (1990), Chapter 1 (pp. 1–1 –1–5).

*Primary Examiner*—Vincent P. Canney
*Attorney, Agent, or Firm*—Steven R. Bartholomew; Robert B. Levy

[57] ABSTRACT

Pseudorandom Boundary-Scan testing of a interconnects within a system (10) is accomplished by first generating a pseudorandom pattern and then filtering the pattern before application to the system to modify values within each pattern that could cause a signal conflict. Each response generated by the system upon application to the system is also filtered to mask non-deterministic values with the response. The filtered response is compared to a set of signatures representing a fault-free condition to detect faults within the system.

13 Claims, 3 Drawing Sheets

METHOD AND APPARATUS FOR PSEUDORANDOM BOUNDARY-SCAN TESTING

TECHNICAL FIELD

This invention relates to a technique for applying pseudorandom patterns to test interconnects in a Boundary-Scan environment.

BACKGROUND ART

Individual interconnections within a system, such as a circuit board containing individual devices, or a combination of circuit boards, may be readily tested by way of the Boundary-Scan test technique described in the publication *IEEE Std. 1149.1 Test Access Port and Boundary Scan Architecture,* available from the IEEE, Piscataway, N.J. (incorporated by reference herein). To accomplish Boundary-Scan testing in accordance with the IEEE 1149.1 standard, the system must possess a Boundary-Scan architecture. To that end, the system must include Boundary-Scan cells or registers serially coupled in one or more scan chains. Some of the cells in each chain may be associated with interconnections within the system and such cells may drive, or be driven by, the signals present at such interconnections.

To initiate testing, a test pattern, comprising a string of bits equal in number to the number of Boundary-Scan cells, is shifted through the chain of cells. The logical value of the bit originally shifted into each input cell is updated in accordance with the value of the signal, if any, that drives the cell. For example, when the signal driving the cell is a logic "1," the cell value becomes a "1." After a prescribed interval following the shifting of a test pattern through the chain of Boundary-Scan cells, another test pattern is shifted through the cells to shift-out the updated string of bits. The shifted-out string of bits, representing the response of the system, is compared to a set of reference values representing a fault-free condition. Any difference between the stream of shifted-out bits and the set of reference values indicates a possible fault in the system.

Presently, the test patterns applied to the system are generated by an Automatic Test Pattern Generator so each pattern is deterministic (readily ascertainable). After generation, each test pattern is stored for subsequent application to each chain of Boundary-Scan cells. The disadvantage of generating test patterns in this fashion is that a memory of sufficient size is needed to store all the patterns. Further, circuitry is needed for applying the test patterns in the right order. In addition, with the present day approach, usually only one chain can be tested at a time.

An alternative approach to accomplishing Boundary-Scan testing is to apply pseudorandom patterns generated by a pseudorandom test pattern generator, such as a Linear Feedback Shift Register (LFSR). The pseudorandom patterns are applied as generated, thus eliminating the need for pregeneration of patterns and a memory for storing such pregenerated patterns. Moreover, pseudorandom pattern generation allows for concurrent testing of more than one Boundary-Scan chain, thus allowing for greater throughput and reduced test time.

While pseudorandom Boundary-Scan testing obviates the need for pattern pregeneration and storage, there are drawbacks with this approach that have precluded its widespread implementation. Not all of the test patterns generated during pseudorandom testing are legitimate. For example, a pseudorandom pattern that drives two opposite values at a net (i.e., an interconnection point) is prohibited because of possible damage to the system undergoing testing. Moreover, the test results achieved by pseudorandom testing may not be deterministic (i.e., repeatable). Lastly, some design practices may limit possible pseudorandom Boundary-Scan testing solutions.

Thus there is a need for a pseudorandom Boundary-Scan test technique that overcomes the foregoing problems.

BRIEF SUMMARY OF THE INVENTION

Briefly, in accordance with the invention, a method is provided for accomplishing Boundary-Scan testing of a system having at least one chain of serially-connected Boundary-Scan cells. The method is initiated by generating a pseudorandom test pattern, typically by means of an LFSR or the like. The pseudorandom test pattern is then filtered to modify bits that may potentially damage the system. In other words, the pattern is filtered to change any bit or combination of bits that might give rise to a conflict. The filtered test pattern is applied to the system by shifting the pattern through the chain of Boundary-Scan cells. In this way, the response to the previously applied pattern is shifted out. Thereafter, the system response is filtered to mask non-deterministic bits. Finally, the filtered response is compared to a reference set of bits representing a fault-free condition.

In practice, this process can be practiced for several different scan chains simultaneously so that the interconnects surrounded by each chain will be tested at the same time. Furthermore, by way of the pseudorandom test technique of the invention, those interconnects that lie between chains can also be tested.

DETAILED DESCRIPTION

Figure 1:
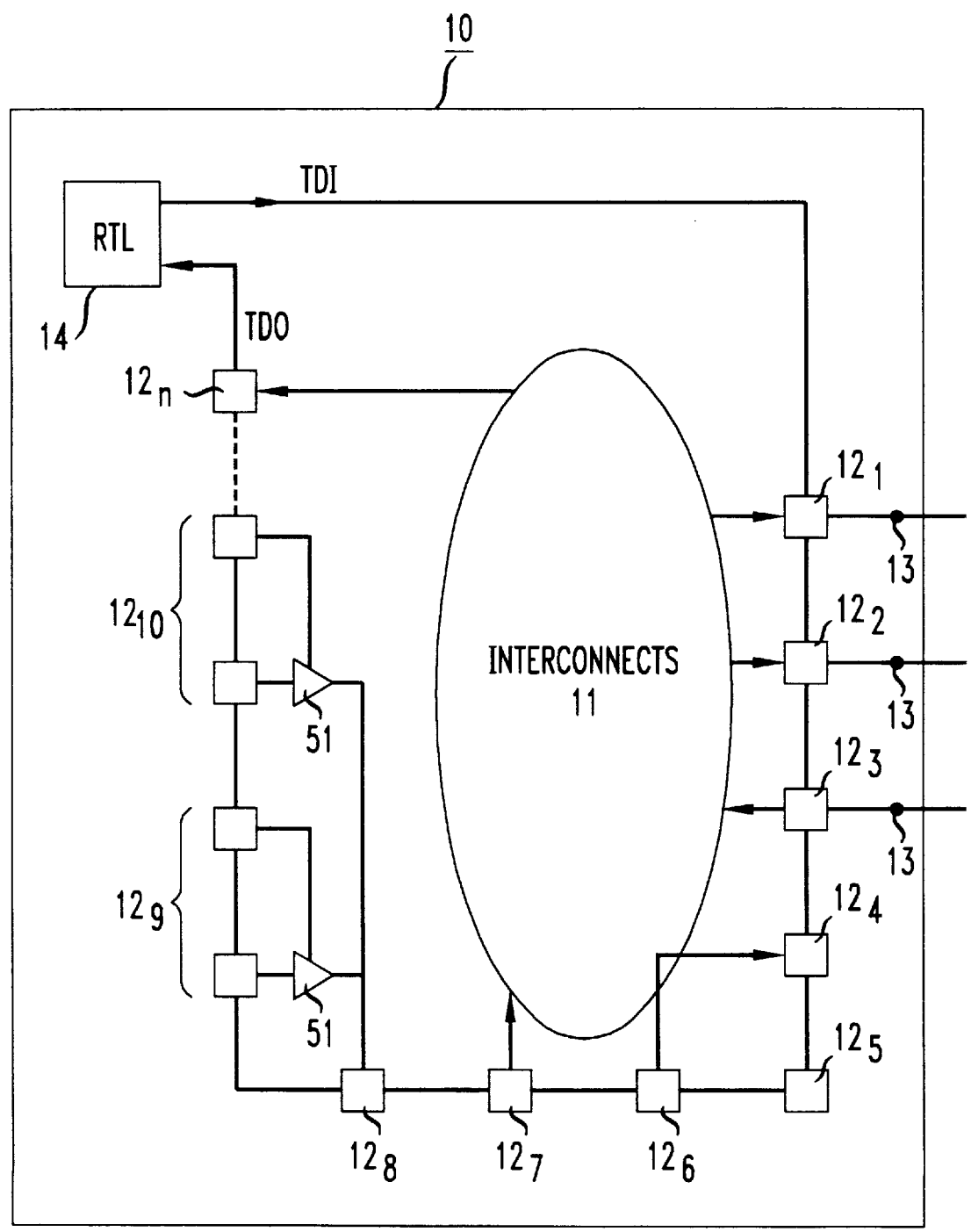
FIG. 1 is a block diagram of a Boundary-Scan chain for testing in accordance with the invention.

FIG. 1 depicts a system 10, such as a circuit board, that includes a plurality of devices (not shown) that are interconnected via a set of interconnects 11. The system 10 has a Boundary-Scan architecture in accordance the IEEE 1149.1 Standard. In that regard, the system 10 includes a plurality of Boundary-Scan cells $12_1$-$12_n$ (where n is an integer) associated with the devices within the system. The cells $12_1$-$12_n$ are serially connected in a serial scan chain having a Test Data Input (TDI) and a Test Data Output (TDO). In the illustrated embodiment, n>10, although it should be understood than n may be smaller or larger, depending on the design of the system 10.

The Boundary-Scan cells $12_1$-$12_n$ may take various forms. For example, the cells $12_1$, $12_2$, and $12_3$ may each take the form of an input/output cell that supplies signals to, or receives signals from, a corresponding one of a set of edge connector pins 13—13. (An input cell, as modified in accordance with the invention, will be discussed with respect to FIG. 5.) Other Boundary-Scan input/output cells may drive, or be driven by, signals at one or more of the interconnects 11. Still other Boundary-Scan cells, such as $12_9$ and $12_{10}$, may take the form of a tri-state driver control or data cell. (A cell structure for a tri-state driver control cell, as modified in accordance with the invention, will be discussed with respect to FIG. 4.) Regardless of their individual structure, the cells $12_1$-$12_n$ each have the capability of storing a single-bit value that is shifted into the cell. The value stored in each cell becomes updated or changed depending on the manner in which the cell is driven.

Figure 2:
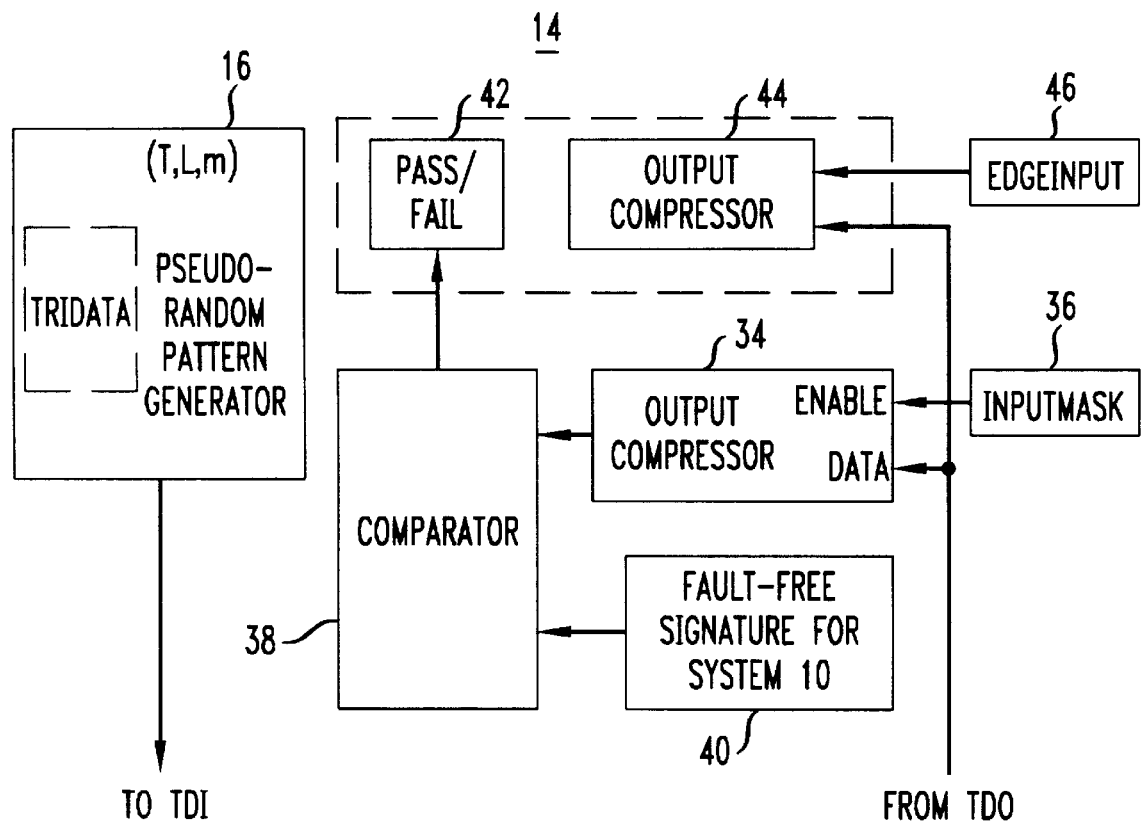
FIG. 2 is a block schematic diagram of a Random Test Logic (RTL) unit for pseudorandom testing the Boundary-Scan chain of FIG. 1.

In the past, Boundary-Scan testing of the system 10 was accomplished by applying deterministic test patterns. Such patterns had to be pregenerated and stored for access by a test controller (not shown). In accordance with the instant invention, the system 10 may be advantageously Boundary-Scan tested without the need for pattern pregeneration and storage by applying pseudorandom test patterns that are generated by an on-board Random Test Logic (RTL) unit 14 whose details will be described hereinafter with respect to FIG. 2. As seen in FIG. 2, the RTL unit 14 comprises a pseudorandom pattern generator 16 for generating pseudorandom patterns that are filtered prior to being applied to the system 10 so that each pattern is always legitimate, (i.e., suitable) for the system.

Before proceeding to discuss the details of the pseudorandom test pattern generator 16, it may be useful to understand why some patterns may be suitable and others are not. With regard to the chain of Boundary-Scan chain $12_1$-$12_n$ illustrated in FIG. 1, the tri-state cells $12_9$ and $12_{10}$ drive the cell $12_8$. Thus, if a pseudorandomly-generated test pattern is applied to (i.e., shifted through) the chain of cells $12_1$-$12_n$ so that different logic values are loaded into the cells $12_9$ and $12_{10}$, then a conflict will occur. Therefore, any test pattern that drives different logic values via the cells $12_9$ and $12_{10}$ is illegitimate.

Figure 3:
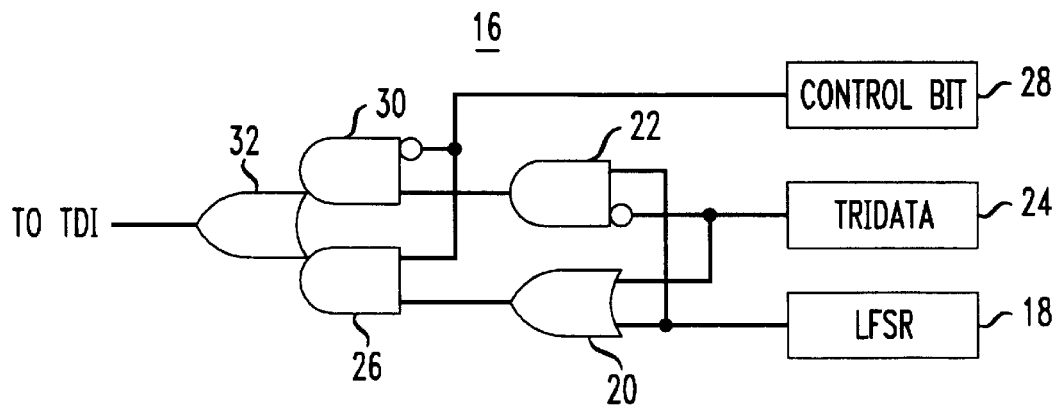
FIG. 3 is a block schematic diagram of a pseudorandom pattern generator that comprises part of the RTL unit of FIG. 2.

Referring now to FIG. 3, there is shown a block schematic diagram of the pseudorandom pattern generator 16 for generating legitimate pseudorandom patterns. As seen in FIG. 3, the generator 16 includes an LFSR 18 that is loaded with a seed value to generate pseudorandom patterns. The LFSR 18 has its output coupled to a first input of a two-input OR gate 20 and to a first non-invert input of a two-input AND gate 22. The OR gate 20 has its second input coupled to the output of a register 24 that contains a pattern of bits TRIDATA. The register 24 has its output coupled to a second inverting input of the AND gate 22 so that the gate logically ANDs the random pattern produced by the LFSR 18 with the bit pattern $\overline{\text{TRIDATA}}$.

The bit pattern TRIDATA comprises n bits. In other words, the bit pattern TRIDATA contains as many bits as Boundary-Scan cells $12_1$-$12_n$ of FIG. 1. Unlike the bits in the pseudorandom test pattern which can take on any value, the bits in the pattern TRIDATA are deterministic from the standpoint that they are chosen to drive each tri-state data cell with the same value. As may now be appreciated, by substituting the bits from the bit pattern TRIDATA for those in the pseudorandom pattern generated by the LFSR 18, the tri-state data cells in the Boundary-Scan chain will be driven by values that do not cause signal conflicts.

Referring to FIG. 3, the OR gate 20 has its output coupled to a first input of a two-input AND gate 26 that has its second input supplied from a register 28 with a control bit latched in that register. The register 28 also supplies the latched control bit to an invert input of a two-input AND gate 30 having a second, non-invert input supplied with the output of the AND gate 22. An OR gate 32 logically OR's the output signals produced by the AND gates 26 and 30 to yield a test pattern at its output that is supplied to the TDI of the chain of Boundary-Scan cells $12_1$-$12_n$.

The nature of the test pattern produced by the pseudorandom pattern generator 18 will depend on the status of the control bits latched in the register 28. At the outset of operation, the control bit register 28 is initialized at "0" and thereafter toggles to select different sources. As described, the LFSR 18 has its pseudorandom output pattern ANDed with the bit pattern $\overline{\text{TRIDATA}}$ and ORd with the bit pattern TRIDATA via the gates 22 and 20, respectively. Which of the these two logical quantities drives the TDI of the chain of Boundary-Scan cells $12_1$-$12_n$ depends on the value of the control bit.

In practice, the detectability of a fault within the system 10 of FIG. 1 may be improved by applying each random pattern twice, once with all "0"s driving each tri-state data cell and once with all "1"s driving each tri-state data cell. Thus, if the LFSR 18 generates pseudorandom patterns $P_1$, $P_2$ ... $P_n$, then the patterns applied by the pseudorandom pattern generator 14 will be ($P_1$ AND $\overline{\text{TRIDATA}}$), ($P_1$ OR TRIDATA), ($P_2$ AND $\overline{\text{TRIDATA}}$) ... ($P_n$ AND $\overline{\text{TRIDATA}}$), ($P_n$ OR TRIDATA).

Once the above-described test patterns are applied to the chain of cells $12_1$-$12_n$, one or more cells become updated as discussed. Thereafter, as each new pattern is applied by shifting through the chain of Boundary-Scan cells $12_1$-$12_n$, the previously applied pattern, as now updated, is shifted out and appears at the TDO of the Boundary-Scan chain of cells. Each shifted-out pattern represents the response of the system 10 of FIG. 1 to the previously applied pseudorandom pattern.

The response that is generated after application of a pseudorandom vector may not be deterministic. For example, if an input cell is unconnected, the value stored in the cell may not be deterministic. If an input cell has none of its drivers enabled, then the cell may have an undeterministic output value. The values shifted out of these cells under such conditions are irrelevant to the test results and thus should be masked.

Referring to FIG. 2, the RTL unit 14 includes an output compressor 34, typically in the form of an LFSR, coupled to the TDO of the chain of Boundary-Scan cells $12_1$-$12_n$ of FIG. 1 for compressing (i.e., logically combining) the responses generated by the system 10 of FIG. 1. Because the applied patterns are pseudorandom in nature, one or more of the responses may contain bit values which are irrelevant to fault detection as discussed previously and thus must be masked. In accordance with the invention, a register 36 is coupled to the output compressor 34 at its enable input for masking such irrelevant bits. In this regard, the register 36 is loaded with a bit string INPUTMASK having n values, the same number as the number of cells $12_1$-$12_n$. Each value in the bit string INPUTMASK corresponds to a particular bit in the response pattern and determines whether that bit is compressed by the output data compressor 34 or not.

Each logic "1" value in the string INPUTMASK enables the output compressor 34 for a corresponding value in the response pattern received from the TDO of the system 10 of FIG. 1. Conversely, each logic "0" disables the output compressor 34. A comparator 38 compares the masked output responses that are compressed by compressor 34 to a fault-free signature for the system 10 that is stored in a register 40. In accordance with the results of the comparison it performs, the comparator may set a bit in a register 42 indicative of whether the system 10 passed or failed the test.

The above-described Boundary-Scan test technique may also be extended beyond the interconnects within the system logic 11 of FIG. 1 to testing the edge connect pins 13—13 of FIG. 1 and their associated interconnects. Unfortunately, the RTL 14, by itself, is typically not capable of testing the pins 13—13 and their associated interconnects. To that end a device (not shown) such as the System Test Extension Module (STEM) disclosed and claimed in U.S. Pat. No. 5,331,274 (incorporated by reference herein) may be employed to observe/control the edge connector pins 13—13 during Boundary-Scan testing.

During intervals when the edge connector pins 13—13 undergo Boundary-Scan testing as described in U.S. Pat. No. 5,331,274, it may be useful to compress the output data from only those Boundary-Scan cells, such as cells $12_1$, $12_2$ and $12_3$, associated with the output pins. For that reason, the RTL unit 14 of FIG. 2 includes a second output compressor 44, typically in the form of an LFSR, that is coupled to the TDO of the chain of Boundary-Scan cells $12_1$-$12_n$, of FIG. 1 in parallel to the output data compressor 40. The output compressor 44 is enabled by a bit string EDGEMASK stored in a register 46 in much the same way that the output data compressor 34 is enabled by the bit pattern INPUTMASK stored in the register 36. For each "1" in the pattern EDGEMASK, the output data compressor 44 is enabled to compress the data from a Boundary-Scan cell associated with the output pin that corresponds to the bit value in the EDGEMASK pattern. Conversely, a "0" in the EDGE-MASK pattern disables the output data compressor 44. Since the output data compressors 34 and 44 are coupled in parallel, they can compute test signatures simultaneously.

Figure 4:
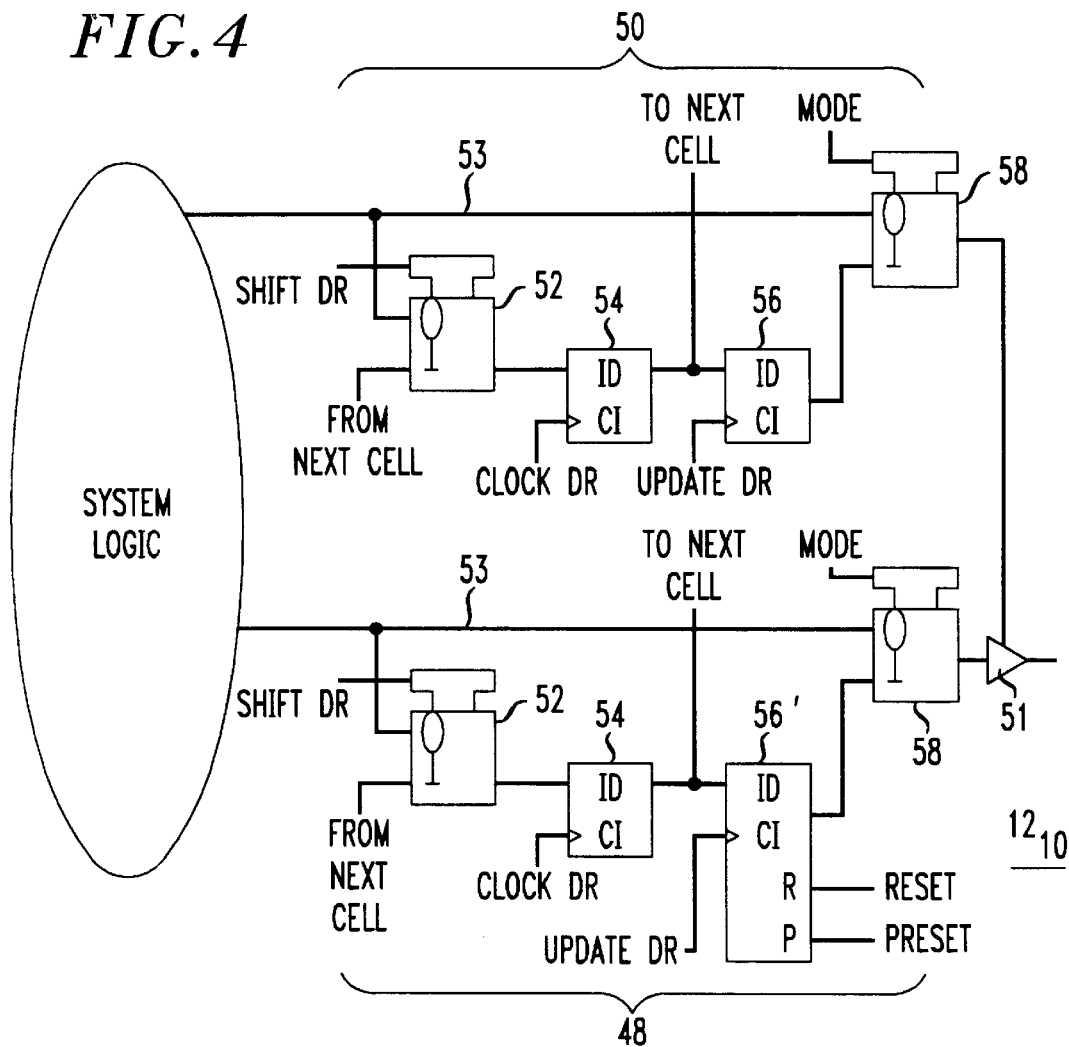
FIG. 4 is a block schematic diagram of a Boundary-Scan cell for a tri-state driver, as modified in accordance with the present invention to facilitate pseudorandom Boundary-Scan testing.

As described above with respect to FIG. 3, the pseudorandom test pattern generator 16 of FIG. 3 is configured to logically combine pseudorandom patterns generated by the LFSR 18 with a set of mask values TRIDATA. Rather than configure the pseudorandom pattern generator 16 with such a mask, it may be desirable to modify each tri-state data cell to alternately drive a "1" and a "0". FIG. 4 shows the tri-state data cell $12_{10}$, as modified in accordance with the invention, to alternately drive a "1" and "0." As seen in FIG. 4, the tri-state cell $12_{10}$ comprises two conventional Boundary-Scan cell structures 48 and 50. The cell 50, described in greater detail below, serves to control a tristate gate data 51 supplied with data via the data cell 48.

The cell structure 50 is identical to the Boundary-Scan cell described in the IEEE publication *IEEE Std.* 1149.1 *Test Access Port and Boundary Scan Architecture* (incorporated by reference herein). To that end, the cell structure 50 includes a first multiplexer 52 supplied via an input line 53 with a first signal from the logic block 11 and a second signal from an upstream Boundary-Scan cell (not shown) in the chain. The multiplexer 52 is controlled by a signal Shift-DR that is supplied, typically from a Test Access Port (TAP) controller (not shown). The multiplexer 52 supplies its output signal to a flip-flop 54 that is clocked by a clock signal CLOCK-DR generated by the TAP controller.

The flip-flop 54 has its output coupled to both to a downstream Boundary-Scan cell (not shown) and a second flip-flop 56 that is clocked by a signal UPDATE-DR generated by the TAP controller. A second multiplexer 58 multiplexes the signal on the input line 53 from the logic block 11 with the output of the flip-flop 56 in accordance with the state of a signal MODE generated by the TAP controller. The output signal of the multiplexer 58 of the cell structure 50 controls drives the tri-state gate 51.

The data cell structure 48 is essentially the same as the control cell structure 50 and like numbers have been used to reference like elements. There is, however, one significant difference. The flip-flop 56 in the cell structure 50 is conventional in its design. In contrast, the cell structure 48 utilizes a presettable second flip-flop 56' that may be preset and reset in accordance with signals Reset and Preset, respectively, supplied to the R and P inputs, respectively, of the flip-flop. In this way, the cell structure 48 can drive the tri-state gate 51 with a "1" or "0" depending on the state of the signals Preset and Reset, respectively.

Figure 5:
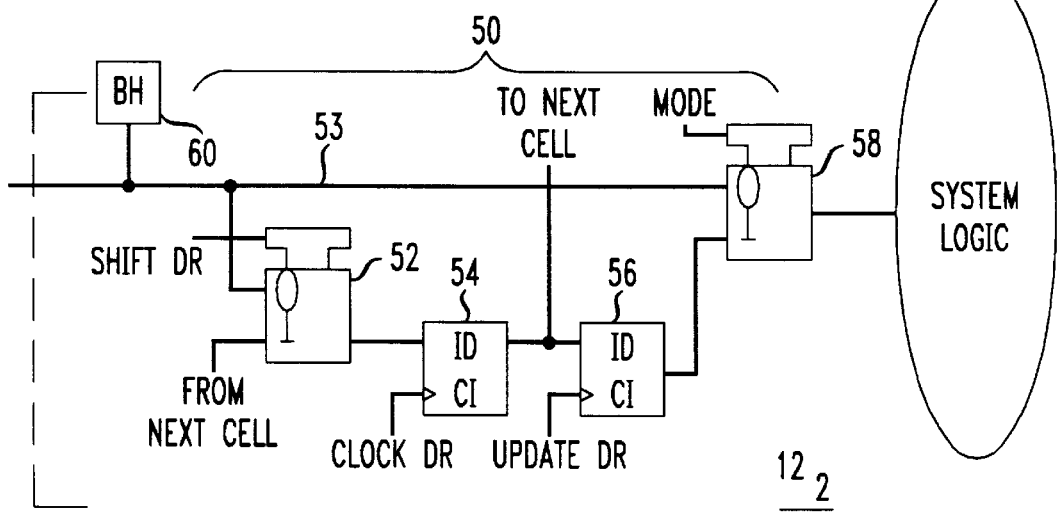
FIG. 5 is a block schematic diagram of an input cell within the system of FIG. 1 as modified in accordance with the present invention to facilitate pseudorandom Boundary-Scan testing.

FIG. 5 shows a block schematic of an input cell, such as $12_2$, as modified in accordance with the invention. In essence, the cell $12_2$ comprises the cell structure 50, and thus, like elements have been used to reference like elements. However, the cell $12_2$ does differ from the cell structure 50 in one respect. In accordance with the invention, the input cell $12_2$ of FIG. 4 includes a Bus Holder (BH) 60 in the form of a latch or register coupled to the input line 53 that supplies an input signal to the multiplexers 52 and 58. The BH 60 maintains the value on the input line 53 when the drivers (not shown) that drive input line the cell $12_2$ are all disabled. In this way, the cell 122 receives a known input value.

Pseudorandom testing in accordance with the method described above can achieve very high fault coverage for different kinds of faults with relatively short lengths. In practice, adequate fault coverage for stuck-at, stuck-open and short-circuit faults can be achieved by applying on the order of $2^{K+1}$ patterns where K is the largest net degree, usually on the order of 10 or less. Since the RTL 14 that controls the pseudorandom testing is typically part of the system 10, the test application time is reduced, permitting a larger number of vectors to be applied in a given interval.

While the pseudorandom test technique of the invention has been described in connection with testing a single circuit board, the technique may be readily employed to test a plurality of boards interconnected by way of a blackplane (not shown) or cables (not shown). Each RTL unit 14 associated with a corresponding board operates to test that board, including the edge connector interconnects connected by the pins 13—13 of FIG. 1. To start such pseudorandom testing, a test command would be broadcast to the RTL units 14 in unison. In response, all of the RTL units 14 would commence testing and would synchronize to a common test clock.

Backplane testing in this manner may pose several issues concerning synchronization of the RTL units 14, especially when the boards associated with such RTL units have different length Boundary-Scan chains. One approach to resolving this problem would be to pause the testing of those boards having shorter length Boundary-Scan chains to allow those having longer chains to catch up before proceeding to the next pattern in the Boundary-Scan test process.

It is to be understood that the above-described embodiments are merely illustrative of the principles of the invention. Various modifications and changes may be made thereto by those skilled in the art which will embody the principles of the invention and fall within the spirit and scope thereof

What is claimed is:

1. A method for Boundary-Scan testing a system having at least one chain of serially-connected Boundary-Scan cells, comprising the steps of:

generating a pseudorandom test pattern containing a plurality of values corresponding in number to the Boundary-Scan cells;

filtering the pseudorandom test pattern to modify any value that may cause a signal conflict upon application of the pattern to the chain of Boundary-Scan cells;

applying the pseudorandom test pattern to the chain of Boundary-Scan cells by shifting each value into a corresponding Boundary-Scan to shift-out a value previously shifted into the cell;

filtering the shifted-out values to mask any value that is non-deterministic; and comparing the filtered shifted-out values to a set of reference values representing a fault free condition.

2. The method according to claim 1 wherein the step of filtering the pseudorandom test pattern includes the step of:

logically combining the pseudorandom test pattern with a predetermined chain of values to substitute at least one preselected value in the predetermined bit chain for a corresponding value in the pseudorandom pattern.

3. The method according to claim 2 wherein the predetermined chain of bits contains values indicative of whether each Boundary-Scan cell corresponds to a tri-state data cell.

4. The method according to claim 1 includes the steps of:

logically ORing the pseudorandom test pattern with a predetermined chain of values to substitute at least one preselected value in the predetermined bit chain for a corresponding value in the pseudorandom pattern;

inverting the predetermined chain of values; and

ANDing the pseudorandom test pattern with the inverted predetermined chain of values to substitute at least one preselected value in the inverted predetermined bit chain for a corresponding value in the pseudorandom pattern.

5. The method according to claim 1 wherein the step of filtering out the shifted out values includes the steps of:

applying the shifted-out values in sequence to an output data compressor that compresses each value when the compressor is enabled; and applying a mask pattern to the compressor to selectively enable the compressor to compress selected ones of the shifted-out values.

6. The method according to claim 5 further including the steps of:

applying the shifted out values in sequence to a second output data compressor that compresses each value when the compressor is enabled; and applying a second mask pattern to the second compressor to selectively enable the second compressor to compress selected ones of the shifted-out values.

7. Apparatus for Boundary-Scan testing a system having at least one chain of serially-connected chain of Boundary-Scan cells, comprising:

means for generating a pseudorandom test pattern containing a plurality of values corresponding in number to the Boundary-Scan cells and;

means, coupled to said generating means, for filtering the pseudorandom test pattern to modify any value that may cause a conflict upon application of the pattern to the chain of Boundary-Scan cells, means for filtering each of a set of values that are shifted out of the chain of Boundary-Scan cells upon application of the filtered test pattern to mask any value that is non-deterministic; and means for comparing the filtered shifted-out values to a set of reference values representing a fault free condition.

8. The apparatus according to claim 7 wherein said means for masking the pseudorandom test patterns comprises:

a register for storing a predetermined chain of values; and logic means for combining the predetermined chain of values with the pseudorandom pattern generated by said pattern generator means to substitute at least one value in the chain of predetermined bit values for a corresponding value in the pseudorandom test pattern.

9. The apparatus according to claim 7 wherein the means for filtering comprises:

a first output data compressor supplied with values shifted out of the chain of Boundary-Scan cells for selectively compressing such values when the compressor is enabled; and a register containing a mask pattern for enabling the compressor to compress selected values shifted out of the chain of Boundary-Scan cells.

10. The apparatus according to claim 9 further including:

a second output data compressor supplied with values shifted out of the chain of Boundary-Scan cells for selectively compressing such values when the compressor is enabled; and a second register containing a second mask pattern for enabling the compressor to compress selected values shifted out of the chain of Boundary-Scan cells.

11. A tri-state Boundary-Scan cell assembly comprising a tri-state gate;

a first Boundary-Scan cell structure for controlling the tri-state gate; and a second Boundary-Scan structure for driving the tri-state gate; WHEREIN THE IMPROVEMENT COMPRISES:

the second Boundary-Scan structure being presettable by external preset and reset signals to drive the tri-state gate with a first and second, respectively, known values.

12. The tri-state gate according to claim 11 wherein the second Boundary-Scan structure includes a presettable flip-flop to render the structure presettable.

13. In combination with a Boundary-Scan cell having an input line on which signals are supplied to the cell, THE IMPROVEMENT COMPRISING:

a register coupled to the cell input line for maintaining the input line with a prescribed logic value.

* * * * *